United States Patent
Ogura

Patent Number: 6,059,216
Date of Patent: May 9, 2000

[54] TAPING MEMBER SUPPORTING DEVICE FOR AN ELECTRONIC COMPONENT FEEDING APPARATUS

[75] Inventor: Naoyuki Ogura, Hamamatsu, Japan

[73] Assignee: Tenryu Technics Co., Ltd., Hamamatsu, Japan

[21] Appl. No.: 09/200,949

[22] Filed: Nov. 30, 1998

[30] Foreign Application Priority Data

Dec. 17, 1997 [JP] Japan ................................. 9-346926

[51] Int. Cl.$^7$ ............................. B65H 16/02; B65H 23/08
[52] U.S. Cl. .................................. 242/422.5; 242/594.2; 242/595
[58] Field of Search ............................ 242/422.5, 421.3, 242/595, 594.2, 594.1

[56] References Cited

U.S. PATENT DOCUMENTS

| 993,866 | 5/1911 | Page | 242/422.5 |
|---|---|---|---|
| 2,767,931 | 10/1956 | Woods et al. | 242/422.5 |
| 4,832,271 | 5/1989 | Geleziunas | 242/422.5 |
| 5,279,472 | 1/1994 | Hongo et al. | 242/422.5 |
| 5,573,629 | 11/1996 | Rock et al. | 242/423.1 |

FOREIGN PATENT DOCUMENTS

| 4-179663 | 6/1992 | Japan | 242/422.5 |
|---|---|---|---|
| 2108929 | 5/1983 | United Kingdom | 242/595.1 |

*Primary Examiner*—John M. Jillions
*Attorney, Agent, or Firm*—Kanesaka & Takeuchi

[57] ABSTRACT

A taping member supporting device is used in an electronic component feeding apparatus, and supports a taping member having electronic components thereon and wound around a tape reel. The supporting device includes an elongated supporting member contacting a lower side portion of the taping member at an outermost feeding side thereof to rotationally support the taping member thereon. An attaching member is connected to the supporting member to attach the supporting member to an electronic component feeding apparatus.

3 Claims, 6 Drawing Sheets

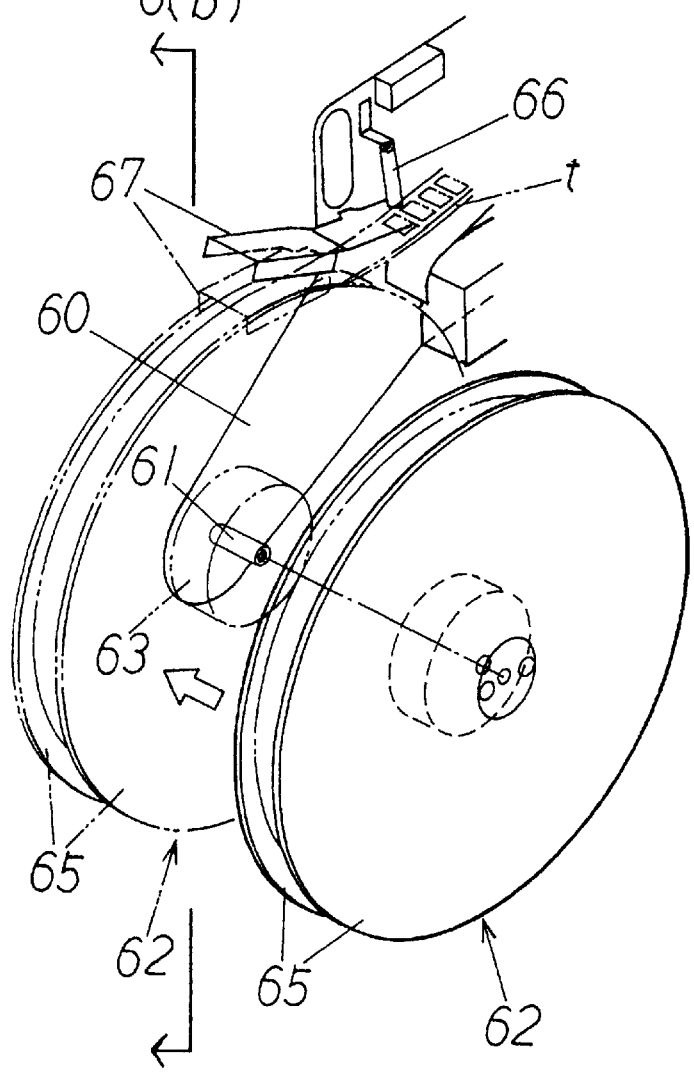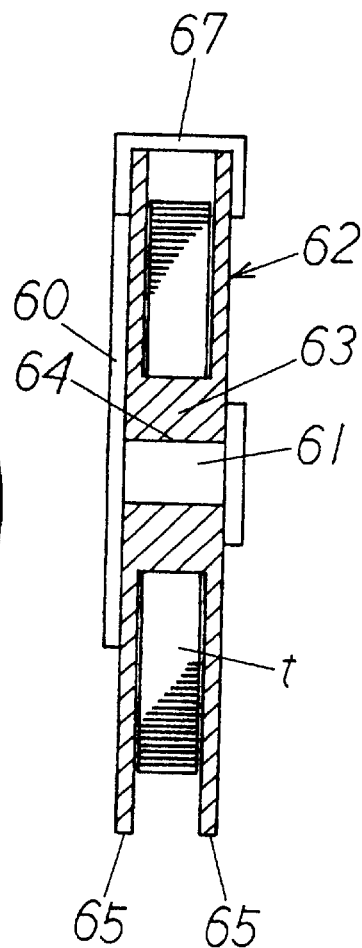
FIG. 6(a) Prior Art
FIG. 6(b) Prior Art

TAPING MEMBER SUPPORTING DEVICE FOR AN ELECTRONIC COMPONENT FEEDING APPARATUS

BACKGROUND OF THE INVENTION AND RELATED ART STATEMENT

The present invention relates to a taping member supporting device for an electronic component feeding apparatus in an electronic component mounting machine for attaching or mounting electronic components on a printed circuit board, wherein a taping member having the electronic components thereon can be positively fed and a large number of electronic component feeding apparatuses is attached to the mounting machine in a widthwise direction thereof.

Heretofore, in a mounting machine for mounting electronic components on a printed circuit board, the electronic components have been generally fed to the mounting machine by using a taping member having a large number of the electronic components thereon with a predetermined pitch between the adjacent electronic components and wound around a tape reel many times. In order to increase a feeding efficiency of the electronic components to the printed circuit board, as shown in FIG. 4, a large number of electronic component feeding apparatuses G is provided on one or both sides of an electronic component mounting machine F.

The taping member t is continuously or intermittently fed toward the electronic component mounting machine F by a feeding device, not shown, and rotated together with the tape reel.

As a structure thereof, for example, a tape reel supporting device as shown in FIGS. 6(a), 6(b) has been known, wherein a supporting shaft 61 projecting from an arm 60 is inserted into a hole 64 of a core 63 of a tape reel 62 to rotationally support the tape reel.

However, in the structure, the arm 60 and the supporting shaft 61 project outwardly from a pair of flanges 65 of the tape reel 62, so that a minimum space between the adjacent tape reels 62 is determined by the lengths of the projected portions. Therefore, many taping members t can not be provided in a row.

Also, the tape reel is excessively rotated by an energy when the taping member is sequentially taken out by the feeding device, so that the stable feeding of the electronic components may not be obtained, or loosening of the taping member may happen during its feeding to thereby cause a trouble in feeding the taping member thereafter.

Therefore, as shown in FIGS. 6(a) and 6(b), a reel presser 67 is provided on the arm 60 to abut against edges of the flanges 65 of the tape reel 62 by a spring 66. Therefore, the brake is applied to the flanges 65 of the tape reel 62 to prevent the tape reel 62 from being excessively rotated.

However, since the necessary parts for the braking action are required, the device becomes complicated and a production cost for the reel brake is required.

In view of the above defects, it is an object of the present invention to provide a taping member supporting device for an electronic component feeding apparatus for supporting a taping member wound around a tape reel to be freely fed, wherein the taping member can be positively fed, and many electronic component feeding apparatuses are attached on one or both sides of an electronic component mounting machine in the widthwise direction thereof.

Another object of the present invention is to provide a taping member supporting device for an electronic component feeding apparatus as stated above, wherein the taping member on the tape reel can be rotatably supported without loosening of the taping member due to an excessive rotation of the tape reel.

A further object of the present invention is to provide a taping member supporting device for an electronic component feeding apparatus as stated above, wherein the taping member supporting device can be simplified and made compact.

Further objects and advantages of the invention will be apparent from the following description of the invention.

SUMMARY OF THE INVENTION

In order to attain the above objects, a taping member supporting device supports a tape reel around which a long taping member having a great number of electronic components thereon is wound many times so that the taping member is sequentially fed to an electronic component mounting machine from an outer peripheral portion thereof. The taping member supporting device for an electronic component feeding apparatus includes an elongated supporting member contacting a surface on the outermost feeding side of a lower portion of the taping member to rotationally support the taping member, and an attaching member provided to an appropriate portion of a main frame and connected to the supporting member.

Also, the taping member supporting device for an electronic component feeding apparatus may include an elongated supporting member for rotationally holding the taping member, an abutting member contacting a surface on the outermost feeding side of the taping member to provide a predetermined rotational friction resistance to the taping member, and an attaching member provided to an appropriate portion of a main frame and connected to the supporting member.

Further, the tape reel is formed of a core and a pair of side plates disposed on both sides of the core. Also, the abutting member has a width such that the abutting member can be accommodated in a space between the pair of the side plates.

In a taping member supporting method, a tape reel around which a long taping member having a great number of electronic components thereon is wound many times is supported so that the taping member is sequentially fed to an electronic component mounting machine from an outer peripheral portion thereof. The taping member supporting method for an electronic component feeding apparatus comprises allowing a lower side portion of the taping member to rotatably contact an elongated supporting member to support the tape reel so that a rotational resistance can be obtained by a self-weight of the tape reel.

BRIEF DESCRIPTION OF THE DRAWINGS

FIG. 6(a) is a perspective view for showing a conventional taping member supporting device for an electronic component feeding apparatus; and FIG. 6(b) is a sectional view taken along line 6(b)—6(b) in FIG. 6(a).

DETAILED DESCRIPTION OF PREFERRED EMBODIMENTS

Next, embodiments of a tape reel or taping member supporting device for an electronic component feeding apparatus and a supporting method thereof according to the present invention are explained with reference to the accompanying drawings.

Figure 1:
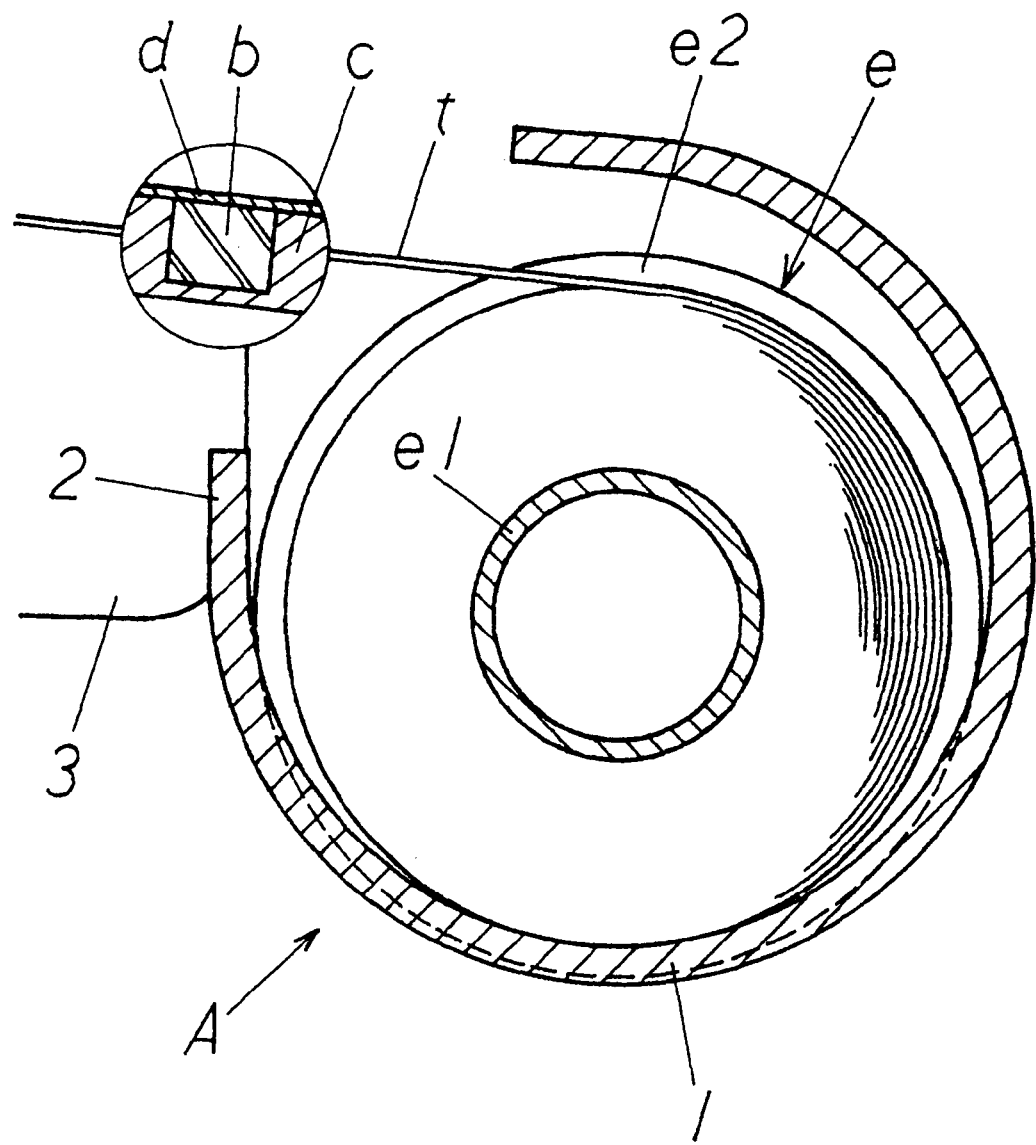
FIG. 1 is a sectional view for showing an essential part of a first embodiment of a taping member supporting device for an electronic component feeding apparatus according to the present invention.
Figure 2:
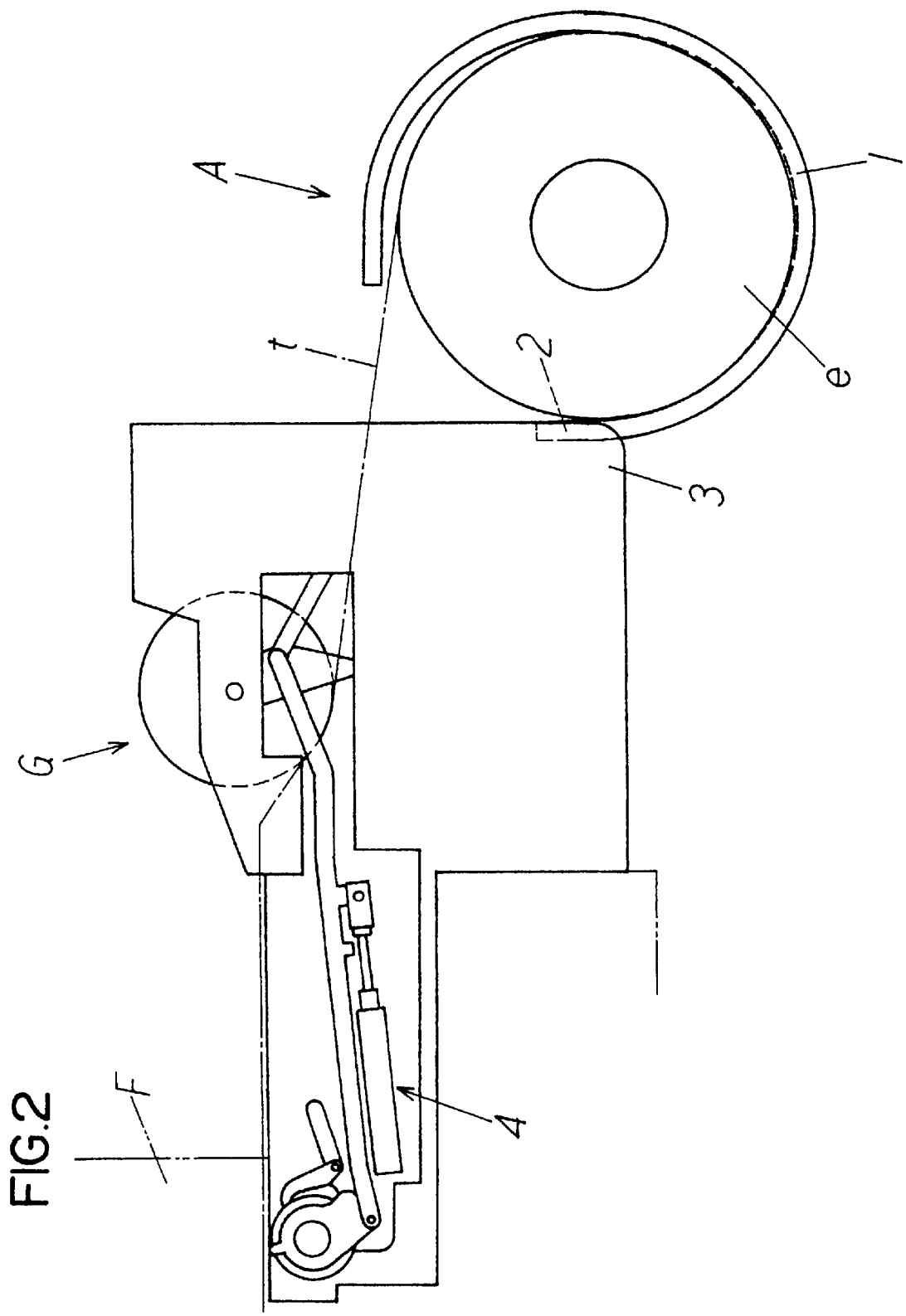
FIG. 2 is a front view for showing an attached state of the device as shown in FIG. 1 to the electronic component feeding apparatus.
Figure 3:
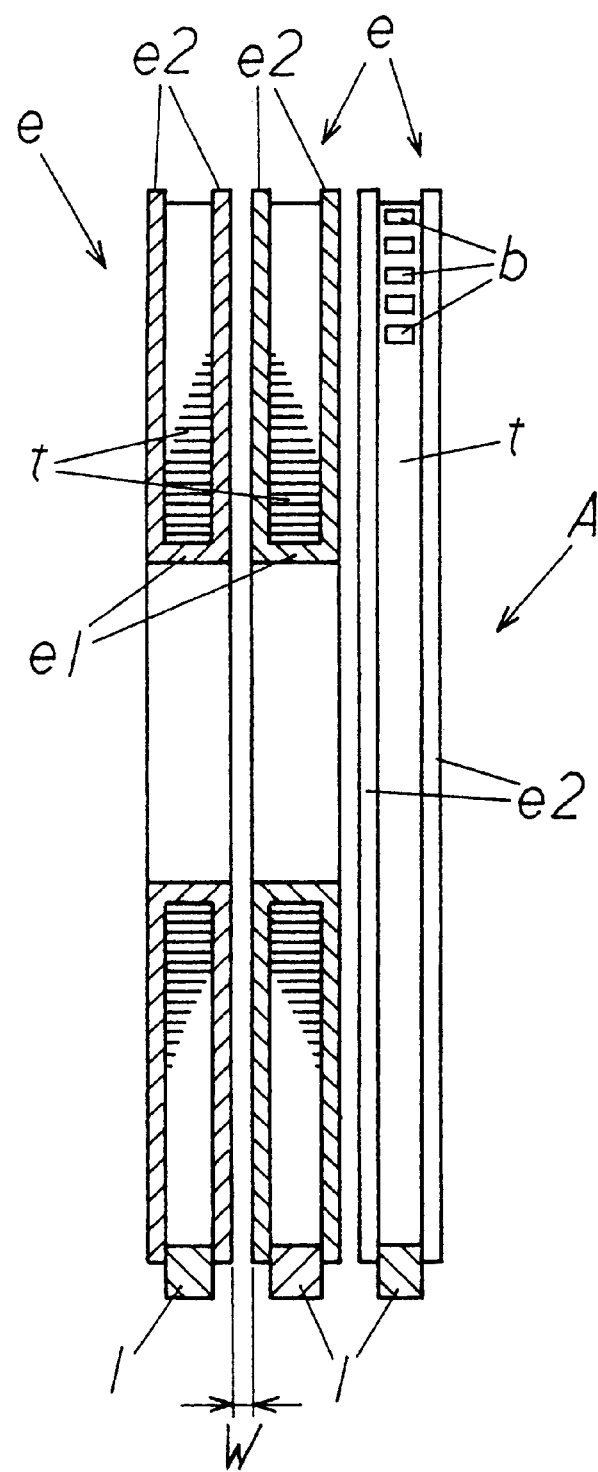
FIG. 3 is a partial sectional side view of the device shown in FIG. 1.

In FIGS. 1–3, A represents a taping member supporting device for an electronic component feeding apparatus, wherein a long taping member t formed of a carrier tape c on which a great number of electronic components b is attached and covered with a cover tape d, is wound around a tape reel e many times so that the taping member t is subsequently fed from an outer circumferential portion thereof to an electronic component mounting machine F. FIGS. 1 and 2 show a first embodiment which is basically formed of a supporting member 1 and an attaching member 2.

Incidentally, the tape reel e includes a core e1 and a pair of side plates e2 provided on both sides of the core e1 and having a section of approximately an H-shape. The taping member t is fixed to the core e1 at a feeding end portion thereof, and wound around the core until it comes to the circumferential edges of the side plates e2.

The supporting member 1 contacts at least a part of the surface of the taping member on the outermost feeding side, i.e. wound outermost circumferential side, located lower than a rotation center of the taping member t, to rotationally support the taping member t against its own weight to be rotated or fed freely.

The supporting member 1 has a width to be accommodated in a space between the pair of the side plates e2 of the tape reel e, and its abutment surface has a predetermined contacting area. The supporting member 1 is formed in an approximately U shape, so that the area contacting the lower side portion of the taping member t can be increased. Also, since the supporting member 1 is sandwiched between the side plates e2, even though the tape reel e is supported only by its own weight, stable stay and rotation thereof can be obtained.

The width of the supporting member 1 is defined to be the same as, or slightly wider or narrower than the width of a groove of the tape reel e, provided that the side plates e2 are made of a material having flexibility, such as a synthetic resin, paper, or thin sheet metal. In case the width of the supporting member 1 is the same as or slightly wider than the width of the groove, since the side surfaces of the supporting member 1 and the side plates e2 abut against each other with a friction, together with the self-weight mounting as described before, braking action with respect to the rotation of the tape reel e can be obtained.

The attaching member 2 is connected to the supporting member 1, and attached to a main frame, for example, a frame 3 of an electronic component feeding apparatus G.

Figure 4:
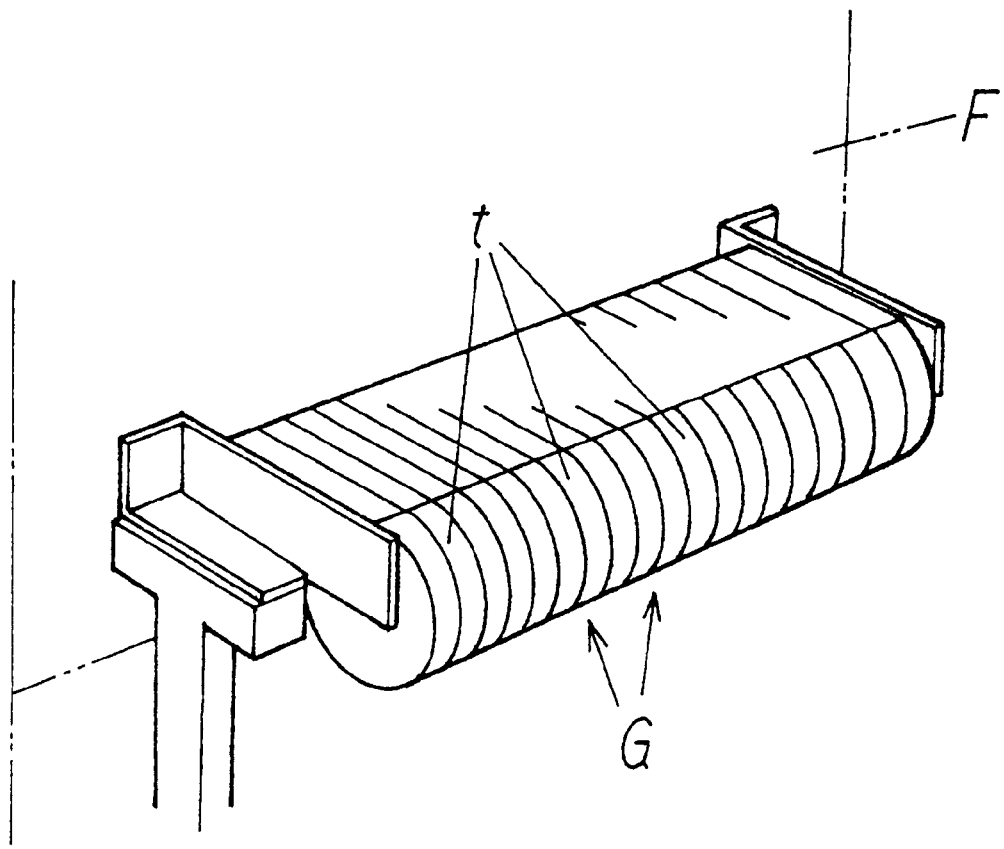
FIG. 4 is a perspective view for showing an attached state of the electronic component feeding apparatuses shown in FIG. 2 to an electronic component mounting machine.

Incidentally, the electronic component feeding apparatus G feeds the electronic components b to the electronic component mounting machine F through a known feeding device 4 with a predetermined pitch, and a large number of the electronic component feeding apparatuses G is disposed on one side or both sides of the electronic component mounting machine F, as shown in FIG. 4.

The tape reel supporting device A for the electronic component feeding apparatus and the supporting method thereof as described above are operated as follows.

When the tape reel e, around which a predetermined length of the taping member t is wound, is placed from an upper part of the supporting member 1, or slid in from a side portion of the supporting member 1 so that the supporting member 1 is located in a space between the side plates e2, a surface at the outermost circumferential feeding side of the taping member t wound around the tape reel e contacts an upper surface of the supporting member 1, and inner surfaces of the pair of side plates e2 face both side surfaces of the supporting member 1, as shown in FIG. 3.

Therefore, the tape reel e is stably held by the supporting member 1, and there is no risk of its inclining or falling off.

Figure 5:
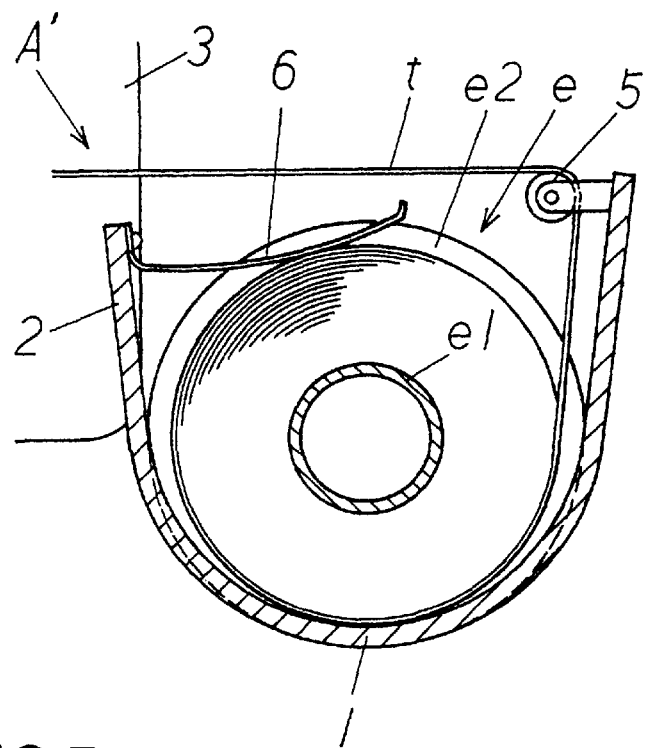
FIGS. 5(a) and 5(b) are sectional views of essential parts of second and third embodiments of the taping member supporting device for an electronic component feeding apparatus according to the present invention.
Figure 5:
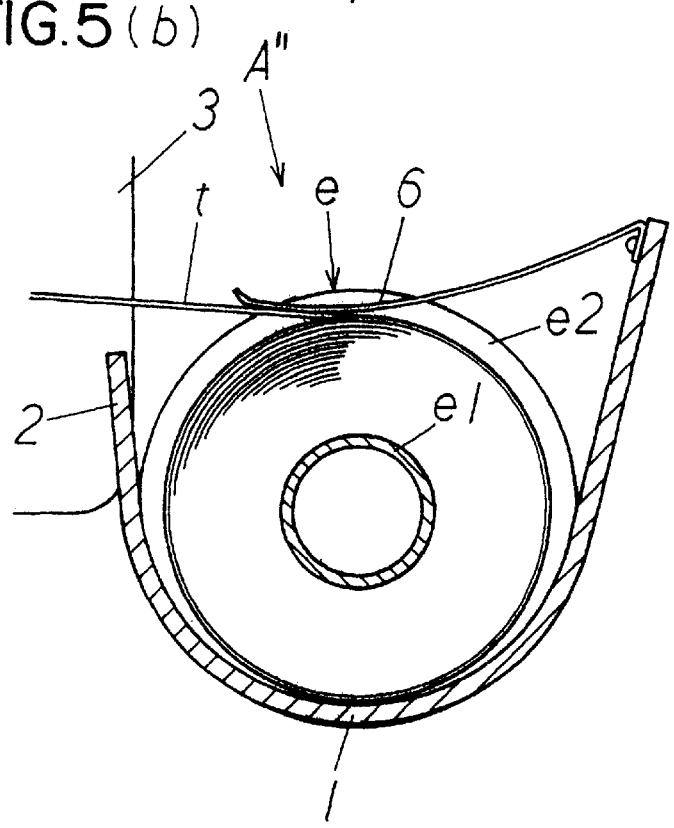

In this state, when the taping member t is taken out by the feeding device 4 in the electronic component feeding apparatus G toward the electronic component mounting machine F, the taping member t is taken out while the tape reel e is rotating on the supporting member 1. As another example, the taping member t may be taken out through a detour member 5, such as a roller, provided to an upper part of the supporting member 1, as shown in FIG. 5(a).

At this time, since a weight of the taping member t wound around the taping reel e is applied to the supporting member 1, a surface on the outermost feeding side, i.e. the outermost side of the windings of the taping member t is transferred with a predetermined friction between the supporting member 1 and the taping member t. Therefore, a predetermined braking force is applied to the taping member t when it is taken out by the feeding device 4. Thus, there is no possibility of the tape reel e being rotated excessively due to an energy, i.e. inertia, when the taping member t is taken out, and the taping member t is positioned in the electronic component feeding apparatus G with a certain tension.

Therefore, defects, such as loosening, meandering, or being caught due to a blind movement, of the taping member t in the electronic component feeding apparatus G does not occur.

In case a large number of electronic component feeding apparatuses G is provided, since the device A has no members projecting outward therefrom, the space w between the adjacent tape reels e can be narrowed as much as possible, as shown in FIG. 3. The adjacent tape reels may abut against each other.

Thus, a large number of electronic component feeding apparatuses G can be attached to one side or both sides, which have limited attaching spaces, of the electronic component mounting machine F.

Next, second and third embodiments of a device A', A" according to the present invention are described with reference to FIGS. 5(a), 5(b). The device A', A" is formed of a supporting member 1 for holding the taping member t; an abutting member 6 contacting a surface on the outermost feeding side of a taping member t so that a predetermined rotational friction resistance is applied to the taping member t; and an attaching member 2 connected to the supporting member 1 to be provided to an appropriate position of a main frame.

More specifically, the present embodiment is structured such that the supporting member 1 supports the tape reel e, and the abutting member 6 applies a predetermined braking force to the taping member t wound around the tape reel e when it is rotated. The abutting member 6 contacts a surface on the outermost feeding side of the taping member t to press the tapping member t against the supporting member 1.

Any position within an area not hindering feed of the taping member t can be selected as a position for the surface on the outermost feeding side of the taping member t where the abutting member 6 contacts. An upper portion or side portion of the taping member t is suitable.

More specifically, the taping member t may be fed through a detour member 5 as shown in FIG. 5(a), or the abutting member 6 may contact the feeding portion of the taping member t as shown in FIG. 5(b).

In case the abutting member 6 is made of an elastic material, a predetermined pressure is applied to the surface of the taping member t, and when the tape reel e for the taping member t is attached or removed, the abutting member 6 can be retreated outward so that work can be facilitated. Moreover, since a pressing force is applied to the taping member t, attachment of the tape reel e on the supporting member 1 can be more improved.

Incidentally, the supporting members 1 of the second and third embodiments have the same function and effect as those in the supporting member 1 of the first embodiment.

As described above, in the taping member supporting device for the electronic component feeding apparatus of the present invention, since the taping member wound around a core between a pair of side plates of the tape reel directly contacts or abuts against the supporting member by its own weight, the tape reel can be rotatably supported, and the taping member acts on the tape reel as a brake with its own weight, so that the defects, such as loosening caused by an excessive rotation of the tape reel when the taping member is fed, can be prevented.

Especially, since the supporting member has a combined function for supporting the tape reel and providing the braking action, an extra structure for stopping rotation of the tape reel is not required to thereby provide a simple and compact device at a low cost.

Also, since no projecting member is provided outside the pair of the side plates of the tape reel, the adjacent tape reels can be disposed with a space therebetween as narrow as possible, so that the electronic component feeding apparatuses can be provided as many as possible on the attaching portion of the electronic component mounting machine.

Further, since there is provided the supporting member which applies a predetermined rotational friction resistance to the taping member by contacting the surface on the outermost feeding side of the taping member, function for stopping rotation of the tape reel can be improved, and stable mounting of the tape reel to the holding member can be obtained.

While the invention has been explained with reference to the specific embodiments of the invention, the explanation is illustrative, and the invention is limited only by the appended claims.

What is claimed is:

1. A combination of a taping member with a tape reel, and a taping member supporting device for use in an electronic component feeding apparatus, wherein said taping member has electronic components thereon and wound around the tape reel, said tape reel having a core and a pair of side plates provided on both sides of the core such that the taping member is wound around the core between the side plates, and said taping member supporting device includes an elongated supporting member having a width corresponding to a width of the tape reel, said supporting member being disposed in a space between the pair of the side plates and contacting a lower side portion of the taping member at an outermost feeding side thereof to rotationally support the taping member thereon.

2. A combination according to claim 1, further comprising an abutting member disposed above the supporting member and contacting the taping member to provide a predetermined frictional resistance to the taping member.

3. A combination according to claim 1, wherein said elongated supporting member is curved to have a curvature greater than a radius of the taping member wound on the tape reel.

* * * * *